(12) United States Patent
Augustine et al.

(10) Patent No.: US 9,830,988 B2
(45) Date of Patent: Nov. 28, 2017

(54) APPARATUS TO REDUCE RETENTION FAILURE IN COMPLEMENTARY RESISTIVE MEMORY

(71) Applicant: Intel Corporation, Santa Clara, CA (US)

(72) Inventors: Charles Augustine, Portland, OR (US); Wei Wu, Portland, OR (US); Shigeki Tomishima, Portland, OR (US); Shih-Lien L. Lu, Portland, OR (US); James W. Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/187,646

(22) Filed: Jun. 20, 2016

(65) Prior Publication Data
US 2016/0314838 A1    Oct. 27, 2016

Related U.S. Application Data

(63) Continuation of application No. 14/638,942, filed on Mar. 4, 2015, now Pat. No. 9,373,395.

(51) Int. Cl.
| | | |
|---|---|---|
| G11C 13/00 | (2006.01) | |
| G11C 11/16 | (2006.01) | |
| G11C 7/10 | (2006.01) | |

(52) U.S. Cl.
CPC ........ *G11C 13/0069* (2013.01); *G11C 7/1006* (2013.01); *G11C 11/1673* (2013.01); *G11C 11/1675* (2013.01); *G11C 13/004* (2013.01); *G11C 13/0002* (2013.01); *G11C 13/0004* (2013.01); *G11C 13/0007* (2013.01); *G11C 13/0021* (2013.01); *G11C 13/0033* (2013.01); *G11C 2013/0042* (2013.01); *G11C 2213/79* (2013.01); *G11C 2213/82* (2013.01)

(58) Field of Classification Search
CPC .............. G11C 7/1006; G11C 11/1673; G11C 11/1675; G11C 13/004; G11C 13/0002; G11C 13/0004; G11C 13/0007; G11C 13/0021; G11C 13/0033; G11C 2013/0042; G11C 2213/79; G11C 2213/92
USPC ............... 365/148, 158, 163, 185.02, 189.16
See application file for complete search history.

(56) References Cited

U.S. PATENT DOCUMENTS

| | | | | |
|---|---|---|---|---|
| 5,267,204 A | * | 11/1993 | Ashmore, Jr. | ......... G11C 29/88 365/200 |
| 7,126,869 B1 | | 10/2006 | Chou | |
| 8,085,584 B1 | * | 12/2011 | Kale | .................... G11C 7/1006 365/148 |
| 9,373,395 B1 | * | 6/2016 | Augustine | ............ G11C 13/004 |

(Continued)

OTHER PUBLICATIONS

Non-Final Office Action for U.S. Appl. No. 14/637,297 dated Mar. 14, 2016, 19 pages.

(Continued)

*Primary Examiner* — Tan T. Nguyen
(74) *Attorney, Agent, or Firm* — Green, Howard & Mughal LLP

(57) ABSTRACT

Described is an apparatus which comprises: a complementary resistive memory bit-cell; and a sense amplifier coupled to the complementary resistive memory bit-cell, wherein the sense amplifier includes: a first output node; and a first transistor which is operable to cause a deterministic output on the first output node.

18 Claims, 8 Drawing Sheets

(56) References Cited

U.S. PATENT DOCUMENTS

| | | | |
|---|---|---|---|
| 2006/0067104 A1* | 3/2006 | Hsu | G11C 13/0011 365/148 |
| 2007/0014160 A1* | 1/2007 | Kobernik | G11C 16/26 365/185.23 |
| 2009/0161442 A1 | 6/2009 | New et al. | |
| 2011/0255359 A1 | 10/2011 | Sachdev et al. | |
| 2013/0148443 A1 | 6/2013 | Hold | |
| 2013/0272059 A1 | 10/2013 | Lin et al. | |
| 2013/0301345 A1* | 11/2013 | Noguchi | G11C 11/1675 365/158 |
| 2014/0071740 A1 | 3/2014 | Kim et al. | |
| 2015/0364178 A1 | 12/2015 | Kim et al. | |

OTHER PUBLICATIONS

Notice of Allowance for U.S. Appl. No. 14/637,297 dated Aug. 31, 2016, 8 pages.

Notice of Allowance for U.S. Appl. No. 14/638,942, dated Feb. 11, 2016.

Augustine, C. et al., "Numerical Analysis of Typical STT-MTJ Stacks for 1T-1R Memory Arrays", International Electron Devices Meeting (IEDM) 2010. (4 pages).

Azizi, N. et al., "Low-Leakage Asymmetric-Cell SRAM", Proc. Int'l Symp. Low-Power Electronics and Design (ISLPED 02), ACM Press, 2002, pp. 48-51.; IEEE Transaction on very Large Scale Integration (VLSI) Systems, vol. 11, No. 4, Aug. 2003, pp. 701-715 (15 pages).

Noguchi, H. et al., "Highly Reliable and Low-Power Nonvolatile Cache Memory with Advanced Perpendicular STT-MRAM for High-Performance CPU", IEEE, VLSI Circuits Digest of Technical Papers, 2014 Symposium on VLSI Circuits Digest of Technical Papers, Jun. 2014. (2 pages).

Ricketts, A. et al., "Investigating the impact of NBTI on different power saving cache strategies", IEEE Design, Automation & Test in Europe Conference & Exhibition, Mar. 8-10, 2010, pp. 592-597 (6 pages).

Zhang, C. et al., "Low Static-Power Frequent-Value Data Caches", Design, Automation and Test in Europe Conference and Exhibition, 2004. Proceedings, vol. 1, Feb. 16-20, 2004 (6 pages).

Non-Final Office Action dated May, 4, 2017 for U.S. Appl. No. 15/374,922.

* cited by examiner

| Initial state of the memory cell | Possible final state of the memory cell | Probability of the final state | Value read from the memory cell |
|---|---|---|---|
| Value = 0<br>MTJ1 – P<br>MTJ2 – AP | MTJ1 – P<br>MTJ2 – AP | $(1-p)^2$ | Value = 0 |
| | MTJ1 – AP<br>MTJ2 – AP | $p(1-p)$ | Value = undefined |
| | MTJ1 – P<br>MTJ2 – P | $(1-p)p$ | Value = undefined |
| | MTJ1 – AP<br>MTJ2 – P | $(p)^2$ | Value = 1 |
| Value = 1<br>MTJ1 – AP<br>MTJ2 – P | MTJ1 – AP<br>MTJ2 – P | $(1-p)^2$ | Value = 1 |
| | MTJ1 – P<br>MTJ2 – P | $p(1-p)$ | Value = undefined |
| | MTJ1 – AP<br>MTJ2 – AP | $(1-p)p$ | Value = undefined |
| | MTJ1 – P<br>MTJ2 – AP | $(p)^2$ | Value = 0 |

| Initial state of the memory cell | Possible final state of the memory cell | Probability of the final state | Value read from the memory cell |
|---|---|---|---|
| Value = 0<br>MTJ1 – P<br>MTJ2 – AP | MTJ1 – P<br>MTJ2 – AP | $(1-p)^2$ | Value = 0 |
| | MTJ1 – AP<br>MTJ2 – AP | $p(1-p)$ | Value = 0 |
| | MTJ1 – P<br>MTJ2 – P | $(1-p)p$ | Value = 0 |
| | MTJ1 – AP<br>MTJ2 – P | $(p)^2$ | Value = 1 |
| Value = 1<br>MTJ1 – AP<br>MTJ2 – P | MTJ1 – AP<br>MTJ2 – P | $(1-p)^2$ | Value = 1 |
| | MTJ1 – P<br>MTJ2 – P | $p(1-p)$ | Value = 0 |
| | MTJ1 – AP<br>MTJ2 – AP | $(1-p)p$ | Value = 0 |
| | MTJ1 – P<br>MTJ2 – AP | $(p)^2$ | Value = 0 |

Fig. 4 ced bit-cell based device. However, complementary MTJ based memory bit-cells may suffer from uncertainty read issues when retention error occurs upon a read mode. A retention error generally refers to an error when one of the MTJs in the complementary MTJ based memory bit-cell is flipped resulting in a conflicting sensing mode with two MTJs storing the same values.

APPARATUS TO REDUCE RETENTION FAILURE IN COMPLEMENTARY RESISTIVE MEMORY

CLAIM FOR PRIORITY

This application is a continuation of U.S. patent application Ser. No. 14/638,942, filed on 4 Mar. 2015, titled "APPARATUS TO REDUCE RETENTION FAILURE IN COMPLEMENTARY RESISTIVE MEMORY," which is incorporated herein by reference in its entirety for all purposes.

BACKGROUND

A complementary Magnetic Tunneling Junction (MTJ) device can provide larger sensing margin than a single MTJ bit-cell based device. However, complementary MTJ based memory bit-cells may suffer from uncertainty read issues when retention error occurs upon a read mode. A retention error generally refers to an error when one of the MTJs in the complementary MTJ based memory bit-cell is flipped resulting in a conflicting sensing mode with two MTJs storing the same values.

One way to solve this issue is to employ a second read mode, which identifies the confliction by reading the two MTJs (of the complementary MTJ bit-cell) separately. However, the second read mode requires complicated reading logic and increases reading latency.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4 illustrates a table with possible states of a complementary MTJ memory-cell, with reference to Sense Amplifier of FIG. 3 for storing '0 and '1 and their probabilities with a given MTJ failure probability, according to some embodiments.

DETAILED DESCRIPTION

Figure 1:
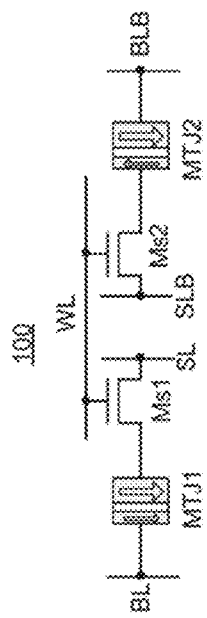
FIG. 1A illustrates a complementary Magnetic Tunneling Junction (MTJ) memory bit-cell.
FIG. 1B illustrates a truth table of the complementary MTJ memory bit-cell of FIG. 1A.
FIG. 1C illustrates a table with possible states of a complementary MTJ memory-cell for storing '0 and '1 and their probabilities with a given MTJ failure probability.

Several new types of solid-state, high-density, non-volatile memories store information using a memory element with a variable resistance. For example, the resistance of spin transfer torque (STT)—magnetic random access memory (MRAM) depends on the relative magnetization polarities of two magnetic layers. Other types of resistive memory include resistive RAM (ReRAM) and conductive bridging RAM (CBRAM), whose resistances depend on the formation and elimination of conduction paths through a dielectric or an electrolyte. There is also phase change memory (PCM), for which the resistivity of a cell depends on the crystalline or amorphous state of a chalcogenide. Although the underlying memory element for these (and possibly other) resistive memory technologies may vary, methods for writing to and reading from them can be electrically similar and are encompassed by various embodiments of the present disclosure.

Some embodiments describe a method and apparatus to resolve read conflict or uncertainty in complementary resistive bit-cell(s) using a sense-amplifier. In some embodiments, a circuit is described for selective bit-inversion in order to reduce the retention failure errors in resistive memory design with complementary resistive memory devices. For example, in some embodiments, retention failure problem is mitigated by conditionally inversing the data store in the memory array (formed of complementary resistive memory bit-cells). In some embodiments, an additional status bit is used to store an indication whether the data in inverted.

Some embodiments describe a biased read logic. In some embodiments, the majority bit value (e.g., number of ones or zeros) of a to-be stored word always equals to a value forced by the biased read circuit (or a sense amplifier). For example, if '0 is forced by the biased read logic (or the sense amplifier), then the majority of bits in a word (or cache line, page, or read/write unit) stored in the memory array should be '0'. In such embodiments, when the number of bits of ones in a word to be stored in memory are in majority, bit-wise inversion is performed. In some embodiments, an additional bit is used to record the status of each word before it is stored. This additional bit is referred to here as the Polarity Bit. For example, if the Polarity Bit is set to '1 then it may mean that the number of ones in the word to be stored is greater than the number of zeros.

In some embodiments, a circuit is provided which identifies the uncertainty in the complementary resistive memory bit-cell(s). In some embodiments, the uncertainty problem in the complementary resistive memory bit-cell is solved by forcing the conflicting read mode into one pre-defined value (e.g. '0 or '1) using the biased read logic. In some embodiments, a circuit is described which forces the sensed output of the complementary resistive memory bit-cell to be either '0 or '1. In some embodiments, the circuit is part of a sense amplifier or the biased read logic. In some embodiments, retention failure is reduced by keeping the majority bit value in a word to be consistent with the pre-defined value, such that it always has a greater than 50% correct rate.

There are many technical effects of various embodiments. For example, some embodiments remove or reduce the uncertainty associated with error bit (i.e., when one of the complementary resistive memory bit-cell(s) flips due to retention error).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical or wireless connection between the things that are connected, without any intermediary devices. The term "coupled" means either a direct electrical, physical, or wireless connection between the things that are connected or an indirect electrical, physical, or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates a complementary Magnetic Tunneling Junction (MTJ) memory bit-cell 100. Complementary bit-cell 100 consists of two bit-cells, where each bit-cell includes a source transistor coupled in series to an MTJ device. For example, bit-cell to the left consists of MTJ1 device which is coupled in series to an n-type source transistor Ms1, where one layer of the MTJ1 device is coupled to a bit-line (BL), the gate terminal of transistor Ms1 is coupled to word-line (WL), the source/drain terminal of transistor Ms1 is coupled source-line (SL), and the drain/source terminal of transistor Ms1 is coupled to another terminal of the MTJ1 device. Likewise, the bit-cell to the right consists of MTJ2 device which is coupled in series to an n-type source transistor Ms2, where one layer of the MTJ2 device is coupled to a complementary bit-line (BLB), the gate terminal of transistor Ms2 is coupled to the WL, the source/drain terminal of transistor Ms2 is coupled to a complementary source-line (SLB), and the drain/source terminal of transistor Ms2 is coupled to another terminal of the MTJ2 device.

Here, the term "complementary bit-line" refers to a bit-line that behaves electrically opposite to the "bit-line" during write operation. For example, when BL is a logic high, then BLB is a logic low and vice versa during write operation. Likewise, the term "complementary source-line" refers to a source-line that behaves electrically opposite to the "source-line" during write mode. For example, when SL is a logic high, then SLB is a logic low and vice versa during write mode. During read operation, SL and SBL are forced to ground, in some embodiments. During read operation, BL and BLB are set to an intermediate voltage level (i.e., a voltage level between power supply Vcc and ground), according to some embodiments of the disclosure.

FIG. 1B illustrates truth table 120 of the complementary MTJ memory bit-cell 100 of FIG. 1A. It is pointed out that those elements of FIG. 1B having the same reference numbers (or names) as the elements of any other figure can operate or function in any manner similar to that described, but are not limited to such.

Truth table 120 shows four modes—Read, Write-0, Write-1, and Retention modes. In the first mode, MTJ1 and MTJ2 devices are read differentially by a sense amplifier. The self-referenced configuration of the complementary bit-cell allows for higher read margins than single bit-cells because the self-referenced configuration results in larger voltage or current difference than that achieved by single bit-cells. In the second mode, a zero (i.e., logic low) is written to the complementary bit-cell 100. For example, MTJ1 is biased such that the free and pinned magnets of MTJ1 have the same magnetization direction (i.e., parallel 'P') while the MTJ2 is biased such that the free and pinned magnets of the MTJ2 have opposite magnetization direction (i.e., anti-parallel "AP"). Here, 'P' condition of the MTJ refers to storing of logic low (i.e., '0) and "AP" condition of the MTJ refers to storing of logic high (i.e., '1).

In the third mode, a one (i.e., logic high) is written to complementary bit-cell 100. For example, MTJ2 device is biased such that the free and pinned magnets of MTJ2 have the same magnetization direction (i.e., parallel 'P') while MTJ1 is biased such that the free and pinned magnets of MTJ1 have opposite magnetization direction (i.e., anti-parallel "AP"). A logic high is written to the MTJ1 device by asserting the WL (i.e., WL=1), asserting the BL (i.e., BL=1 and BLB=0), and de-asserting the SL (i.e., SL=0 and SLB=1). In the second and third modes, MTJ1 and MTJ2 devices are set to opposite values for write operation.

In the fourth mode, complementary bit-cell 100 retains its magnetic conditions. Previously, MTJ based bit-cell was treated as a nonvolatile flash-like memory and data loss was not considered an issue. However, recent studies suggest that MTJ based bit cells suffer from random bit flip due to thermal excitation against the spin potential barrier. During retention mode, it is possible that MTJ1 or MTJ2 or both can flip their values (i.e., the magnetization direction of the free magnet layer may change).

FIG. 1C illustrates Table 130 with possible states of complementary MTJ memory-cell 100 for storing '0 and '1 and their probabilities with a given MTJ failure probability. It is pointed out that those elements of FIG. 1C having the same reference numbers (or names) as the elements of any other figure can operate or function in any manner similar to that described, but are not limited to such.

The first column (from the left) is the initial state of the memory cell (e.g., whether complementary bit-cell 100 has an initial value of '0 or '1). For example, when MTJ1 is conditioned in parallel and MTJ2 is conditioned in antiparallel, complementary bit-cell 100 stores a zero. Likewise, when MTJ2 is conditioned in parallel and MTJ1 is conditioned in anti-parallel, complementary bit-cell 100 stores a one.

The second column (from the left) is the possible temporary state of the memory cell. In some cases, the magnetization direction of the free magnet layer may switch relative to the initial condition causing the stored value to flip. The third column from the left is the probability of this temporary state. For example, 'p' is the probability that the bit-cell 100 is flipping, and (1-p) is the probability that the bit-cell 100 is not flipping (i.e., retaining its initially stored value).

Writing a binary '0 or '1 (i.e., a logic low or a logic high, respectively) into complementary MTJ bit-cell 100 typically involves driving applied current through, or voltage across, the resistance element in the cell (here, the NM device) force it into a higher-resistivity or a lower-resistivity state (e.g., by means of spin transfer torque with STT-MRAM, heating with PCM, metal migration with ReRAM, or metal ion flow with CBRAM).

The fourth column (from the left) is the value read from complementary MTJ bit-cell 100. Here, the shaded boxes identify undefined or incorrect read values while the unshaded boxes identify correct read values.

Table 130 illustrates three cases. In the first case, when one of the MTJs (of complementary MTJ bit-cell 100) fails, the output can be incorrect as shown by the shaded boxes in the last column (i.e., the right most column). In the second case, when both MTJs fail, the output is wrong (i.e., incorrect). Note that, the probability of both bit cells failing is much lower than one MTJ in a bit cell failing. For example, assume 'p' equals to 1E-3, which is pretty large as bit failure rate, then the probability of having either one of the MTJs in their respective bit cells failing is about 2E-3, and the probability for both MTJs in their respective bit cell failing is 1E-6, which is orders of magnitudes lower and negligible. Hence, by identifying and correcting the undefined values, in some embodiments, the failure probability of MTJ read operation is reduced.

Figure 2:
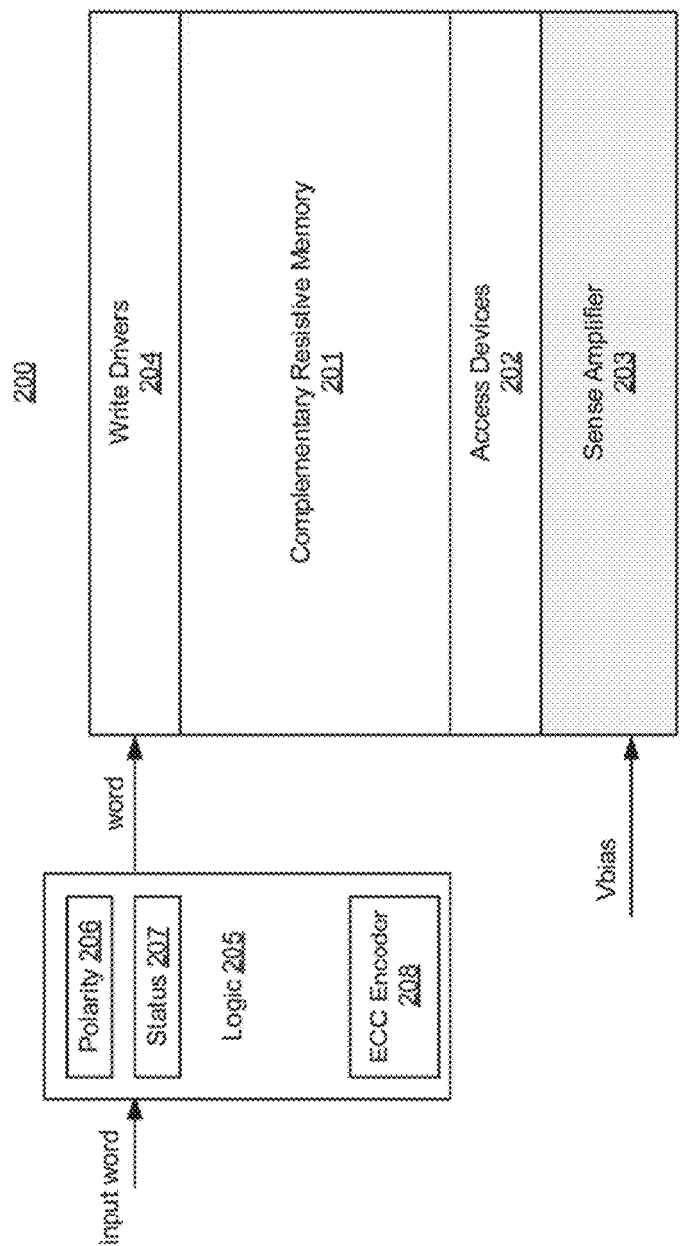
FIG. 2 illustrates high level memory architecture to reduce retention failures in a complementary resistive memory, according to some embodiments of the disclosure.

FIG. 2 illustrates high level memory architecture 200 to reduce retention failures in complementary resistive memory, according to some embodiments of the disclosure. In some embodiments, architecture 200 comprises an array of Complementary Resistive Memory bit-cells 201, Access Devices 202, Sense Amplifier 203, Write Driver 204, Logic 205, register 206 to store Polarity Bit, and register 207 to store Status bit. Examples of resistive memories include MTJ based memories, Phase-Change-Memory (PCM), Magnetic Random Access Memory (MRAM), resistive RAM (ReRAM) and conductive bridging RAM (CBRAM). So as not to obscure the various embodiments, Complementary Resistive Memory 201 is formed of MTJ devices such as complementary bit-cell 100. However, the embodiments are not limited to such and other types of resistive memories can be used too.

In some embodiments, Access Devices 202 are intermediary devices for selectively coupling a column of complementary bit-cells to Sense Amplifier 203. As such, when a complementary bit-cell is selected by the associated WL and BL settings, Access Devices 202 couple that complementary bit-cell to Sense Amplifier 203.

In some embodiments, Sense Amplifier 203 is a differential amplifier that senses or reads bit values stored in MTJ1 and MTJ2 based bit-cells of a selected complementary bit-cell in Complementary Resistive Memory 201. In some embodiments, a transistor in Sense Amplifier 203 is biased with Vbias (e.g., a control voltage) that causes the output of Sense Amplifier 203 to output a predefined value (e.g., '0 or '1).

In some embodiments, Logic 205 is provided which determines a number of ones or zeros in an input word before that word is provided to Write Drivers 204 for storing to Complementary Resistive Memory 201. In some embodiments, if the number of ones is greater than the number of zeros in a word, then Polarity bit 206 is set to '1, else it is set to '0. In some embodiments, Logic 205 is operable to invert the input word depending on the status of Polarity bit 206 (or register 206) and whether Sense Amplifier 203 is configured to force a '0 or '1 on its output when a read uncertainty is experienced. In some embodiments, if Logic 205 inverts the input word then Status bit 207 (or register 207) is set (e.g., set to '1) to track that the inversion of the input word.

In some embodiments, when Sensor Amplifier 203 is configured to force a '1 to its output node OUT and '0 to its complementary output node OUTb then if there are more ones than zeros in the input word, the input word is inverted (i.e., bit wise inversion) before that word is stored to Complementary Resistive Memory 201. Continuing with this example, if there are more zeros than ones in the input word, the input word is not inverted before that word is stored to Complementary Resistive Memory 201 (i.e., the input word is stored in its original form).

In some embodiments, when Sensor Amplifier 203 is configured to force a '0 to its output node OUT and '1 to its complementary output node OUTb then if there are more zeros than ones in the input word, the input word is inverted (i.e., bit wise inversion) before that word is stored to Complementary Resistive Memory 201. Continuing with this example, if there are more ones than zeros in the input word, the input word is not inverted before that word is stored to Complementary Resistive Memory 201 (i.e., the input word is stored in its original form).

In some embodiments, errors in Polarity Bit 206 or Status Bit 207 are corrected using error correction code (ECC). In some embodiments, an ECC encoder 208 is used to encode the input word with Polarity Bit 206, and then the encoded codeword (or word) is stored in Complementary Resistive Memory 201. In some embodiments, an ECC encoder 208 is used to encode the input word with Status Bit 206, and then the encoded codeword (or word) is stored in Complementary Resistive Memory 201.

In some embodiments, when the output OUT of Sensor Amplifier 203 is forced to a known value, the error correction scheme applies an error-and-erasures decoding with information about the location of the error. As such, in some embodiments, the error correction scheme has a higher chance of fixing the codeword which got corrupted by the flipping of at least one of the MTJ devices in the complementary bit-cell.

Figure 3:
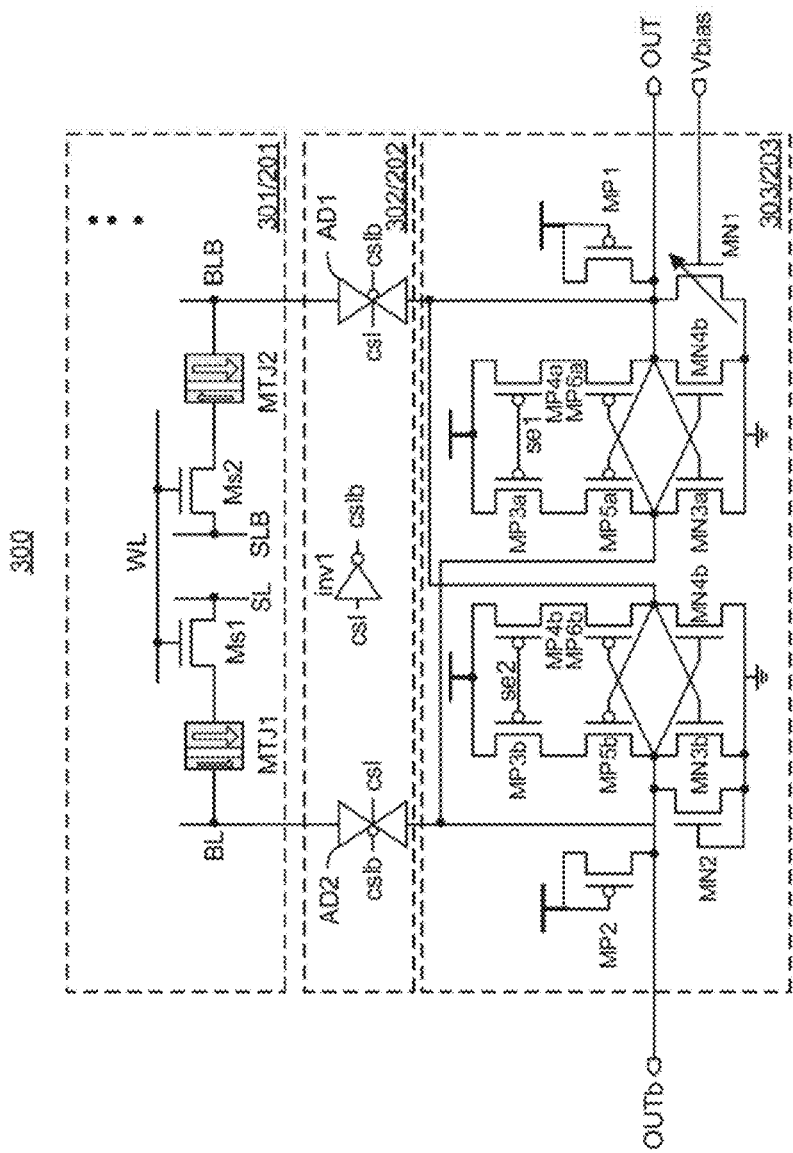
FIG. 3 illustrates part of the memory architecture with a Sense Amplifier circuit to reduce retention failures in a complementary resistive memory, according to some embodiments of the disclosure.

FIG. 3 illustrates part of memory architecture 300 with Sense Amplifier circuit to reduce retention failures in complementary resistive memory, according to some embodiments of the disclosure. It is pointed out that those elements of FIG. 3 having the same reference numbers (or names) as the elements of any other figure can operate or function in any manner similar to that described, but are not limited to such.

Here, one complementary MTJ bit-cell 301 (same as MTJ bit-cell 100) is shown, which is part of Complementary Resistive Memory 201. In some embodiments, Access Devices (AD) 202 include first Access Device AD1 and second Access Device AD2. In some embodiments, AD1 and AD2 are implemented as pass-gates (e.g., transmission gates) controllable by csl (i.e., column select line) and cslb signals, where cslb is a complementary signal of csl and may be generated by inverter inv1. In some embodiments, AD1 is coupled to BLB at one end and Sense Amplifier 303 at another end. In some embodiments, AD2 is coupled to BL at one end and Sense Amplifier 303 at another end.

In some embodiments, Sense Amplifier 303 is a differential amplifier which, when enabled to read complementary MTJ bit-cell 301, couples to BL and BLB via Access Devices AD2 and AD1, respectively. In some embodiments, Sense Amplifier 303 comprises p-type transistors MP1, MP2, MP3a, MP3b, MP4a, MP4b, MP5a, and MP5b; and n-type transistors MN1, MN2, MN3a, MN3bMN4a, and MN4b coupled together as shown.

In some embodiments, the output of Sense Amplifier 303 is a differential output OUT and OUTb. Here, signal names and node names are interchangeably used. For example, OUT is used to refer to signal OUT or node OUT depending on the context of the sentence. Here, nodes se1 and se2 receive Sense Amplifier 303 enable signals se1 and se2, respectively. In some embodiments, se1 and se2 can be coupled to the same signal 'se' sense-enable. In some embodiments, when se=0, the outputs OUT and OUTb are pre-charged and when se=1, the outputs OUT and OUTb are discharged to '0' or remain as '1' depending on the input values to Sense Amplifier 303.

In some embodiments, transistor MN2 is coupled to node OUTb to compensate for the capacitance added to the node OUT due to transistor MN1 in order to make OUT and OUTb symmetric. In some embodiments, transistor MP1 is added to compensate for leakage current contributed by transistor MN1 when Vbias=0V. In some embodiments transistor MP2 is added to compensate for leakage current in transistor MN2. In some embodiments, Sense amplifier 303 has programmable input to control the strength of transistor MN1. In some embodiments, the strength of transistor MN1 is set such that a predetermined (or programmable) Vbias forces the output signal on node Out to '0' and node OUTb to '1' when voltages on nodes BL and BLB are identical due to switching of one of the MTJs (i.e., when one of the bit-cells of complementary bit-cell 301 switches). In one such embodiment, the uncertainty caused by one of the MTJs flipping its stored data is avoided.

In some embodiments, Vbias is programmable. In some embodiments, Vbias is generated by a digital-to-analog (DAC). In other embodiments, Vbias is generated by other circuits. For example, Vbias is generated by a bandgap circuit, or resistor divider. In some embodiments, Vbias, which is a voltage dependent on the process, voltage, and temperature (PVT) corner, can be set based on wafer testing.

FIG. 4 illustrates Table 400 with possible states of complementary MTJ memory-cell 301 in architecture 300, with reference to Sense Amplifier 303 of FIG. 3 for storing '0 and '1 and their probabilities with a given MTJ failure probability, according to some embodiments. Table 400 is described with reference to Table 130. The columns of Table 400 are the same as columns of Table 130.

In this example, the output OUT of Sense Amplifier 300 is biased towards '0 (i.e., upon detecting an uncertainty in the MTJs, because one of the MTJs may have flipped, Sense Amplifier 300 forces a logical '0 on the node OUT). As such, values read from bit-cell 301 are ascertained relative to the values read from bit-cell 100 (comparing Table 130 and Table 400).

In some embodiments, retention failures are reduced if there are more zeros in the input data (or input word) compared to the number of ones in the input data. In some embodiments, a scheme is provided to selectively invert the input data, prior to being stored, to exploit the feature of better data retention of '0 instead of '1. In cases, where input data has more zeroes, the input data is stored as-is in Complementary Resistive Memory 201. In some embodiments, when data has more ones than zeros, the input data to be stored is inverted before storing and Polarity Bit 206 is set to '1. In some embodiments, Logic 205 has an additional Status Bit 207 for each word to indicate if the word is inverted or not. Here, identifier 206 is used to refer to Polarity Bit 206 or register 206 that stores the Polarity Bit, and identifier 207 is used to refer to Status Bit 207 or register 207 that stores the Status Bit.

In some embodiments, an error in Polarity Bit 206 can result in catastrophic failure. In some embodiments, error correction techniques may be used to fix any failure to Polarity Bit 206. For example, the status bit can be decided before performing error correction using ECC 208. In some embodiments, the status bit is included with the input data (e.g., concatenated with the input data) during encoding. In some embodiments, the encoded word is then stored in Complementary Resistive Memory 201. Such embodiments may cause the final encoded word to be below 50% of the dominant value. For example, if the dominant value is '1 and the ECC bits are all 0's, the final encoded word may have fewer ones than zeros. This situation can be corrected by having very fewer ECC bits (e.g., 1/10 of the number of bits in an input word) than data bits.

For example, for 128 bits, SECDED (single-error-correction and double-error detection) overhead is 9 bits (less than 7%); for DECTED (double-error-correction and triple-error detection) overhead is 17 (less than 12%); for 256-bit word, the overhead of SECDED and DECTED are 4% and 7%, respectively. In one example, with more than 10% difference between '0' and '1', ECC should not change the dominant polarity of the bits.

In some embodiments, failure in Polarity Bit 206 can be resolved by performing ECC with Status Bit equal to 0, and then deciding whether the codeword needs to be inverted afterword. In such embodiments, the ECC code is designed with all 1's as a valid codeword. In another word, if 'V' is a valid codeword, the inverted "V'" is also a valid codeword. The above mentioned embodiments are two techniques that address bit flips in Polarity Bit 206. However, the various embodiments are not limited to above two proposed solutions. For example, one other technique is to provide redundant storage of ECC bits (i.e., keep a copy or multiple copies of the ECC bits) and these ECC bits should match after the decoding.

Figure 5:
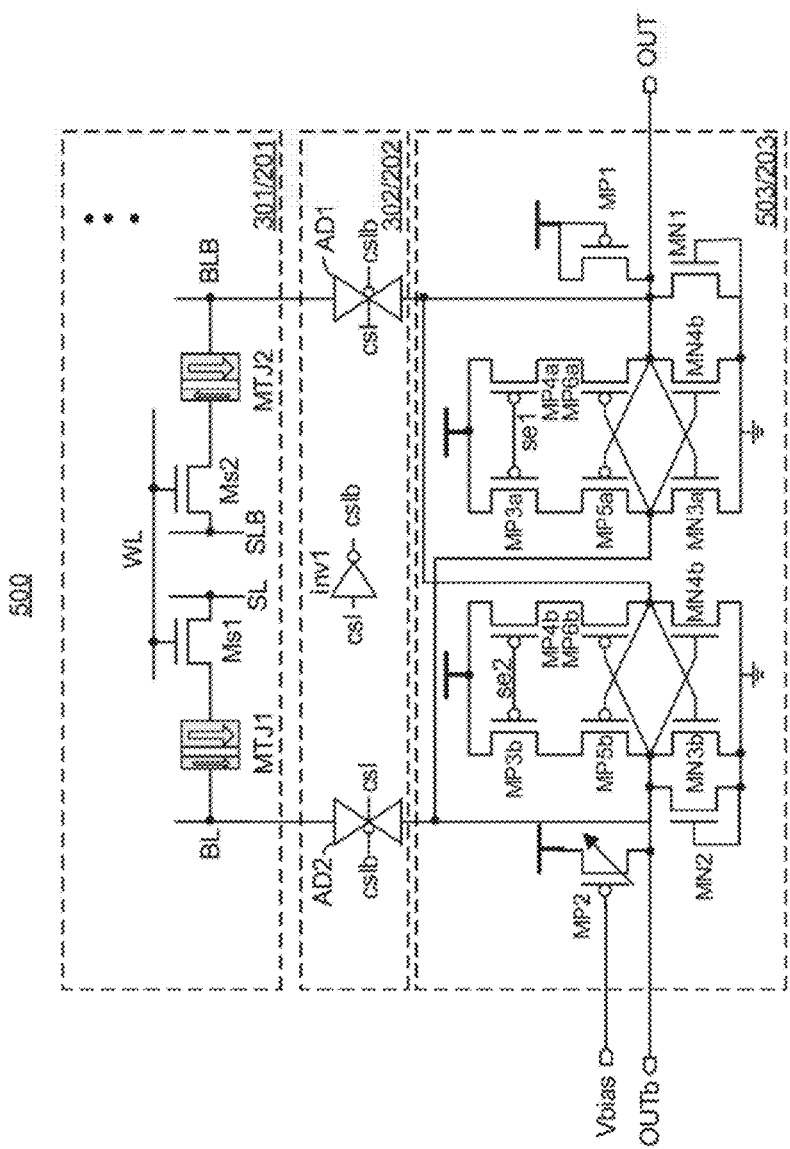
FIG. 5 illustrates a part of the memory architecture with the Sense Amplifier circuit to reduce retention failures in a complementary resistive memory, according to some embodiments of the disclosure.

FIG. 5 illustrates part of the memory architecture 500 with Sense Amplifier circuit to reduce retention failures in complementary resistive memory, according to some embodiments of the disclosure. It is pointed out that those elements of FIG. 5 having the same reference numbers (or names) as the elements of any other figure can operate or function in any manner similar to that described, but are not limited to such. FIG. 5 is described with reference to FIG. 3. So as not to not to obscure the embodiments, differences between FIG. 5 and FIG. 3 are described.

In some embodiments, instead of forcing a '0 on node OUT using transistor MN1, Vbias is provided to the programmable transistor MP2 which forces a '1 on node OUTb. In some embodiments, transistor MN2 is added on the node OUTb to compensate for the capacitance added to the node OUT due to transistor MN1. In some embodiments, transistor MP2 is added to compensate for leakage current contributed by transistor MN2 when Vbias=1V. In some embodiments, transistor MP2 is added to compensate for leakage current in transistor MN2.

In some embodiments, Sense Amplifier 403 has a programmable input to control the strength of transistor MP2. Strength of transistor MP2 can be adjusted by adding or subtracting transistors coupled in parallel to transistor MP2. In some embodiments, the strength of transistor MN2 is set such that a predetermined (or programmable) Vbias forces the output signal on node OUTb to '1 and OUT to '0 when voltages on nodes BL and BLB are identical due to switching of one of the MTJs (i.e., when one of the bit-cells of complementary bit-cell 301 switches). In one such embodiment, the uncertainty caused by one of the MTJs flipping its stored data is avoided.

Figure 6:
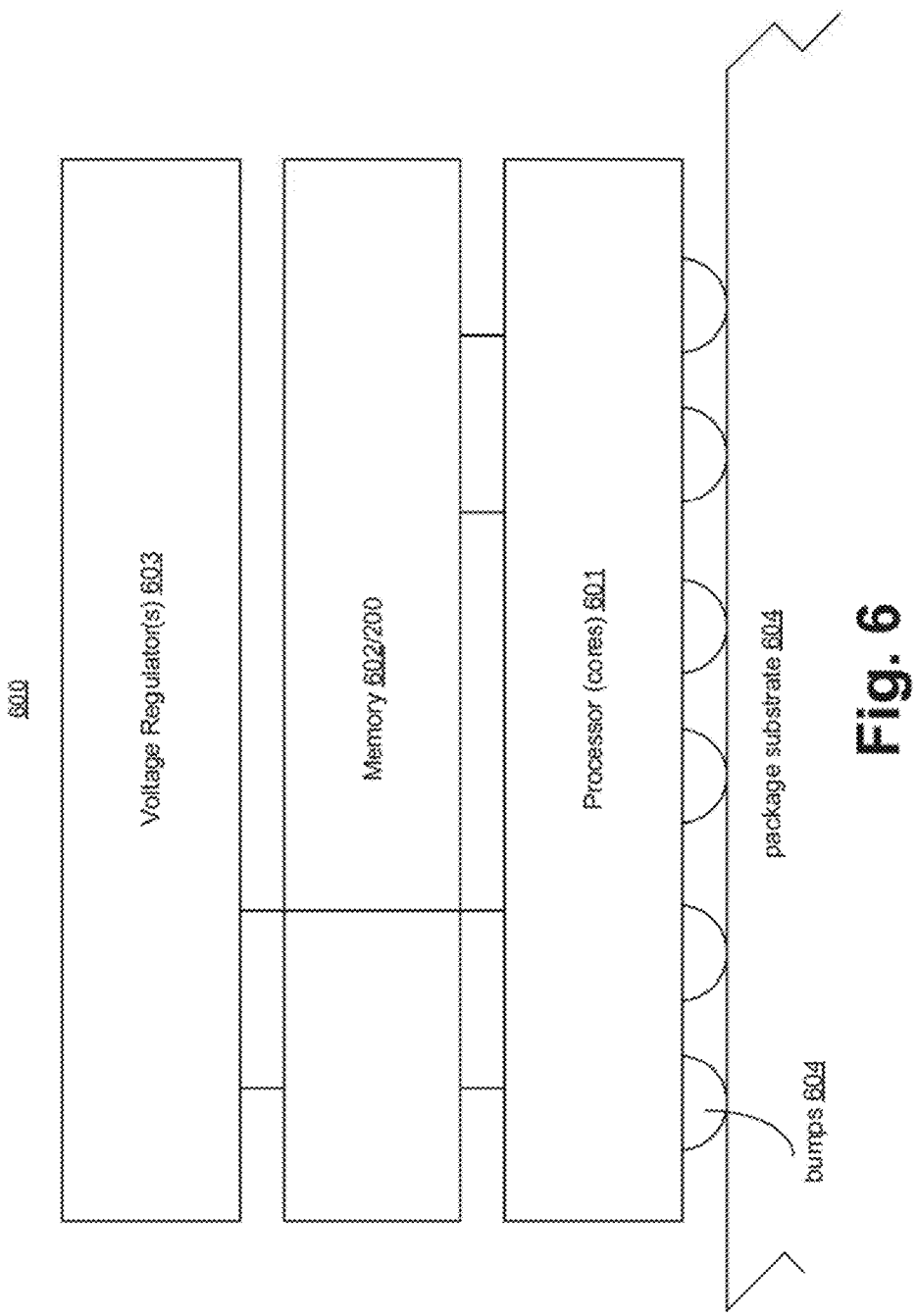
FIG. 6 illustrates a three dimensional (3D) integrated circuit (IC) having memory architecture to reduce retention failures in a complementary resistive memory, according to some embodiments of the disclosure.

FIG. 6 illustrates a three dimensional (3D) integrated circuit (IC) 600 having memory architecture to reduce retention failures in complementary resistive memory, according to some embodiments of the disclosure. It is pointed out that those elements of FIG. 6 having the same reference numbers (or names) as the elements of any other figure can operate or function in any manner similar to that described, but are not limited to such.

In some embodiments, 3D IC 600 comprises a Processor die 601 having one or more processor cores, Memory die 602 (e.g., memory architecture 200 with apparatus to reduce retention failures), Voltage Regulator(s) die 603, bumps 604 for coupling the Processor die 601 to package substrate 604. 3D IC 600 may have more or fewer dies shown packaged together in a single package. For example, a communications die having an integrated antenna may also be coupled to one of the dies in 3D IC 600. The order of the dies may be different for different embodiments. For example, Voltage Regulator(s) 603 may be sandwiched between Memory die 602 and Processor die 601.

Figure 7:
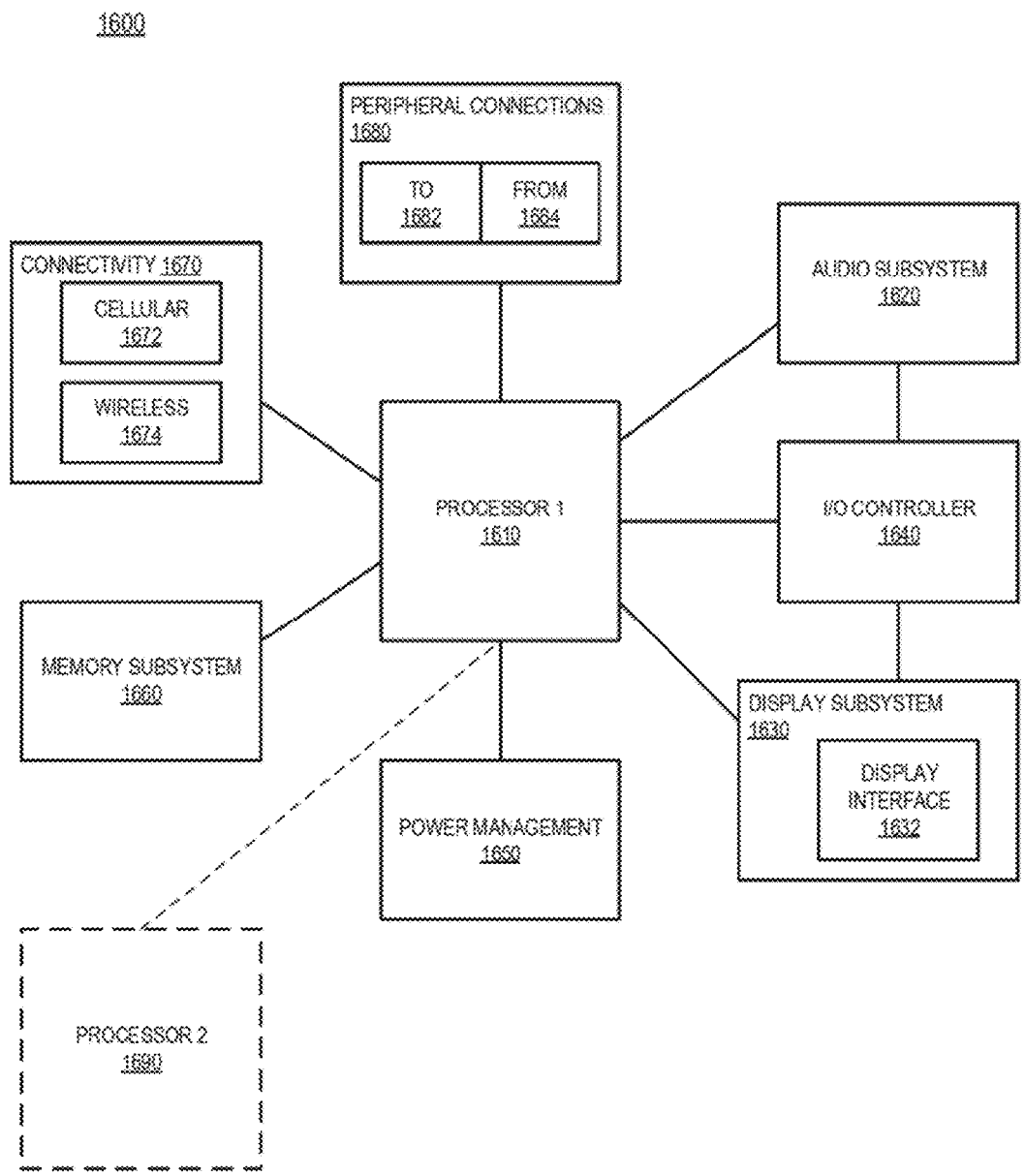
FIG. 7 illustrates a smart device or a computer system or a SoC (System-on-Chip) with memory architecture to reduce retention failures in a complementary resistive memory, according to some embodiments.

FIG. 7 illustrates a smart device or a computer system or a SoC (System-on-Chip) with memory architecture to reduce retention failures in complementary resistive memory, according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with memory architecture to reduce retention failures in complementary resistive memory, according to some embodiments discussed. Other blocks of the computing device 1600 may also include memory architecture to reduce retention failures in complementary resistive memory according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a complementary resistive memory bit-cell; and a sense amplifier coupled to the complementary resistive memory bit-cell, wherein the sense amplifier includes: a first output node; and a first transistor which is operable to cause a deterministic output on the first output node. In some embodiments, the apparatus comprises a first keeper device coupled in series to the first transistor. In some embodiments, the apparatus comprises a second output node to provide a deterministic complementary output when the first transistor causes deterministic output on the first output node. In some embodiments, the apparatus comprises a second transistor coupled to the second output node. In some embodiments, the apparatus comprises a second keeper device coupled in series to the second transistor.

In some embodiments, the first transistor is operable to cause a deterministic output on the first output node when at least one of the resistive memory bit-cells of the complementary resistive memory bit-cell exhibits an uncertain read. In some embodiments, the apparatus comprises logic to determine number of ones and zeros in a word to be written to a memory having the complementary resistive memory bit-cell. In some embodiments, the apparatus comprises a polarity bit to store a bit indicating whether the number of ones in the word is greater than a number of zeros in the word. In some embodiments, the apparatus comprises logic to invert the word when the polarity bit indicates that the number of ones is greater than the number of zeros in the word.

In some embodiments, the inverted word is stored in the memory. In some embodiments, the apparatus comprises a biasing circuit to bias the first transistor to cause the first transistor to source the deterministic output on the first output node. In some embodiments, the complementary resistive memory bit-cell comprises at least one of: a magnetic tunneling junction (MTJ) device; a phase change memory (PCM) cell; or a resistive random access memory (ReRAM) cell. In some embodiments, the memory is at least one of: a magnetic random access memory (MRAM); or a Phase Change Memory (PCM).

In another example, a system is provided which comprises: a processor; a memory coupled to the processor, the memory having apparatus according to the apparatus discussed above; and a wireless interface for allowing the processor to communicate with another device.

In another example, an apparatus is provided which comprises: a complementary resistive memory bit-cell; a bit-line; a complementary bit-line, wherein the bit-line and the complementary bit-line are coupled to the complementary resistive memory bit-cell; a word-line coupled to gate terminals of the complementary resistive memory bit-cell; and a sense amplifier coupled to the complementary resistive memory bit-cell, wherein the sense amplifier is operable to cause a deterministic output regardless of data is stored in the complementary resistive memory bit-cell.

In some embodiments, the sense amplifier includes: a first output node; and a first transistor which is operable to cause the deterministic output on the first output node. In some embodiments, the apparatus comprises a first keeper device coupled in series to the first transistor. In some embodiments, the apparatus comprises: a source line; and a complementary source line, wherein the source line and complementary source line are coupled to the complementary resistive memory bit-cell.

In another example, a system is provided which comprises: a processor; a memory coupled to the processor, the memory having apparatus according to the apparatus discussed above; and a wireless interface for allowing the processor to communicate with another device.

In another example, a system is provided which comprises: a processor having cache which includes: an array of complementary resistive memory bit-cells; and multiplexers coupled to the array; and at least one sense amplifier coupled to the array, wherein the at least one sense amplifier includes: a first output node; and a transistor which is operable to cause a deterministic output on the first output node; and a wireless interface for allowing the processor to communicate with another device.

In some embodiments, the processor comprises one or more processor cores, and wherein the array of complementary resistive memory bit-cells is located in a different die than the one or more processor cores in a three dimensional (3D) integrated circuit. In some embodiments, the complementary resistive memory bit-cell comprises at least one of: magnetic tunneling junction (MTJ) device; a phase change memory (PCM) cell; or a resistive random access memory (ReRAM) cell.

In another example, a method is provided which comprises: causing a deterministic output on a first output node of a sense amplifier, wherein the sense amplifier is coupled to a complementary resistive memory bit-cell. In some embodiments, the method comprises providing a deterministic complementary output on a second output node when the first output node provides the deterministic output. In some embodiments, causing the deterministic output on the first output node is performed when at least one of the resistive memory bit-cells of the complementary resistive memory bit-cell exhibits an uncertain read.

In some embodiments, the method comprises determining number of ones and zeros in a word to be written to a memory having the complementary resistive memory bit-cell. In some embodiments, the method comprises storing a polarity bit indicating whether the number of ones in the word is greater than a number of zeros in the word. In some embodiments, the method comprises inverting the word when the polarity bit indicates that the number of ones is greater than the number of zeros in the word.

In some embodiments, the method comprises storing the inverted word in the memory. In some embodiments, the method comprises biasing a first transistor to cause the first transistor to source the deterministic output on the first output node. In some embodiments, the complementary resistive memory bit-cell comprises at least one of: a magnetic tunneling junction (MTJ) device; a phase change memory (PCM) cell; or a resistive random access memory (ReRAM) cell. In some embodiments, the memory is at least one of: a magnetic random access memory (MRAM); or a Phase Change Memory (PCM).

In another example, an apparatus is provided which comprises: means for causing a deterministic output on a first output node of a sense amplifier, wherein the sense amplifier is coupled to a complementary resistive memory bit-cell. In some embodiments, the apparatus comprises means for providing a deterministic complementary output on a second output node when the first output node provides the deterministic output. In some embodiments, the means for causing the deterministic output on the first output node causes the deterministic output when at least one of the resistive memory bit-cells of the complementary resistive memory bit-cell exhibits an uncertain read.

In some embodiments, the apparatus comprises means for determining number of ones and zeros in a word to be written to a memory having the complementary resistive memory bit-cell. In some embodiments, the apparatus comprises means for storing a polarity bit indicating whether the number of ones in the word is greater than a number of zeros in the word. In some embodiments, the apparatus comprises means for inverting the word when the polarity bit indicates that the number of ones is greater than the number of zeros in the word.

In some embodiments, the apparatus comprises means for storing the inverted word in the memory. In some embodiments, comprises means for biasing a first transistor to cause the first transistor to source the deterministic output on the first output node. In some embodiments, the complementary resistive memory bit-cell comprises at least one of: a magnetic tunneling junction (MTJ) device; a phase change memory (PCM) cell; or a resistive random access memory (ReRAM) cell. In some embodiments, the memory is at least one of: a magnetic random access memory (MRAM); or a Phase Change Memory (PCM).

In another example, a system is provided which comprises: a processor; a memory coupled to the processor, the memory having apparatus according to the apparatus discussed above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an array of complementary resistive memory bit-cells;
   write drivers coupled to the array;
   logic to determine a number of ones or zeros in an input word before that word is provided to the write drivers; and
   a first register to store a polarity of the input word.

2. The apparatus of claim 1, wherein the logic is to store a logic one to the first register when the logic determines that the number of ones is greater than the number of zeros in the input word.

3. The apparatus of claim 1, wherein the logic is to store a logic zero to the first register when the logic determines that the number of ones is less than the number of zeros in the input word.

4. The apparatus of claim 1, wherein the logic is to invert the input word according to the polarity stored in the first register.

5. The apparatus of claim 1 comprises a second register which is to store a bit to track whether the input word is being inverted.

6. The apparatus of claim 1 comprises a sense amplifier coupled to the complementary resistive memory bit-cell.

7. The apparatus of claim 6, wherein the sense amplifier includes:
   a first output node;
   a first transistor which is operable to cause a deterministic output on the first output node;
   a second output node to provide a deterministic complementary output when the first transistor causes deterministic output on the first output node; and
   a second transistor coupled to the second output node.

8. The apparatus of claim 7, wherein the sense amplifier includes:
   a first keeper device coupled in series to the first transistor; and
   a second keeper device coupled in series to the second transistor.

9. The apparatus of claim 7, wherein the first transistor is operable to cause a deterministic output on the first output node when at least one of the resistive memory bit-cells of the complementary resistive memory bit-cell exhibits an uncertain read.

10. The apparatus of claim 7 comprises a biasing circuit to bias the first transistor to cause the first transistor to source the deterministic output on the first output node.

11. The apparatus of claim 1 comprises an error correction code (ECC) encoder to encode the input word with a value of the first register.

12. The apparatus of claim 1, wherein the complementary resistive memory bit-cell of the array comprises at least one of:
   a magnetic tunneling junction (MTJ) device;
   a phase change memory (PCM) cell; or
   a resistive random access memory (ReRAM) cell.

13. A system comprising:
   a processor;
   a memory coupled to the processor, the memory including:
      an array of complementary resistive memory bit-cells;
      write drivers coupled to the array;
      logic to determine a number of ones or zeros in an input word before that word is provided to the write drivers; and
      a first register to store a polarity of the input word; and
   a wireless interface to allow the processor to communicate with another device.

14. The system of claim 13, wherein the processor comprises one or more processor cores, and wherein the array of complementary resistive memory bit-cells is located in a different die than the one or more processor cores in a three dimensional (3D) integrated circuit.

15. The system of claim 13, wherein the complementary resistive memory bit-cell of the array comprises at least one of:
   a magnetic tunneling junction (MTJ) device;
   a phase change memory (PCM) cell; or
   a resistive random access memory (ReRAM) cell.

16. An apparatus comprising:
   an array of complementary resistive memory bit-cells;
   write drivers coupled to the array;
   logic to determine a number of ones or zeros in an input word before that word is provided to the write drivers; and a register to store a bit to track whether the input word is being inverted.

17. The apparatus of claim 16, wherein the complementary resistive memory bit-cell of the array comprises at least one of:
   a magnetic tunneling junction (MTJ) device;
   a phase change memory (PCM) cell; or
   a resistive random access memory (ReRAM) cell.

18. The apparatus of claim 16 comprises a sense amplifier coupled to the complementary resistive memory bit-cell.

* * * * *